United States Patent
Minegishi

(10) Patent No.: US 7,718,714 B2
(45) Date of Patent: May 18, 2010

(54) RESIN CURABLE WITH ACTINIC ENERGY RAY, PHOTOCURABLE AND THERMOSETTING RESIN COMPOSITION CONTAINING THE SAME, AND CURED PRODUCT OBTAINED THEREFROM

(75) Inventor: Shoji Minegishi, Iruma (JP)

(73) Assignee: Taiyo Ink Mfg. Co., Ltd., Tokyo (JP)

( * ) Notice: Subject to any disclaimer, the term of this patent is extended or adjusted under 35 U.S.C. 154(b) by 804 days.

(21) Appl. No.: 11/529,369

(22) Filed: Sep. 29, 2006

(65) Prior Publication Data

US 2007/0027298 A1    Feb. 1, 2007

Related U.S. Application Data

(63) Continuation of application No. PCT/JP2004/004680, filed on Mar. 31, 2004.

(51) Int. Cl.
*C08F 2/42* (2006.01)
*C08J 3/28* (2006.01)
*G03C 1/00* (2006.01)
*G03F 7/00* (2006.01)
*G03F 7/031* (2006.01)

(52) U.S. Cl. .......... 522/181; 522/168; 522/170; 522/178; 528/86; 528/87; 528/106; 528/112; 528/272; 528/271; 528/297; 528/403; 528/421; 430/269; 430/270.1; 430/280.1; 430/281.1; 430/286.1; 430/300; 430/310

(58) Field of Classification Search .......... 522/168, 522/170, 178, 181; 528/86, 87, 106, 112, 528/272, 271, 297, 403, 412; 430/269, 270.1, 430/280.1, 281.1, 300, 310

See application file for complete search history.

(56) References Cited

U.S. PATENT DOCUMENTS 5,009,982 A    4/1991    Kamayachi et al.

2005/0261458 A1*   11/2005   Guo et al. .......... 528/112
2008/0108726 A1*    5/2008   Guo et al. .......... 522/170

FOREIGN PATENT DOCUMENTS

| JP | 61-243869 A | 10/1986 |
|---|---|---|
| JP | 03-253093 A | 11/1991 |
| JP | 2001-324804 A | 11/2001 |
| JP | 2002-128865 A | 5/2002 |
| JP | 2002-265564 A | 9/2002 |
| JP | 2003-107696 A | 4/2003 |
| JP | 2003-177534 A | 6/2003 |
| JP | 2003-192760 A | 7/2003 |
| JP | 2003-280192 A | 10/2003 |
| JP | 2004-061566 A | 2/2004 |

* cited by examiner

*Primary Examiner*—Sanza L McClendon
(74) *Attorney, Agent, or Firm*—Oblon, Spivak, McClelland, Maier & Neustadt, L.L.P.

(57) ABSTRACT

An actinic energy ray-curable resin is obtained by reacting an unsaturated monocarboxylic acid (c) with a terminal epoxy group of an epoxy resin having an unsaturated group and a hydroxyl group in its side chains and an epoxy group in its terminal and further reacting a polybasic acid anhydride (d) with the hydroxyl group of the above-mentioned epoxy resin, wherein the above-mentioned epoxy resin is a product of the polyaddition reaction of a reaction product (I) of a polybasic acid anhydride (a) and a compound (b) having at least one unsaturated double bond and one alcoholic hydroxyl group in its molecule, a compound (II) having at least two carboxyl groups in its molecule, and a bifunctional epoxy compound (III), wherein at least either one of the carboxyl group-containing compound (II) and the bifunctional epoxy compound (III) is a compound containing no aromatic ring. A photocurable and thermosetting resin composition comprising this actinic energy ray-curable resin, a photopolymerization initiator, a diluent, and a cyclic ether compound is useful as a solder resist for a printed circuit board, interlaminar insulating materials for a multi-layer printed circuit board, and the like.

20 Claims, No Drawings

RESIN CURABLE WITH ACTINIC ENERGY RAY, PHOTOCURABLE AND THERMOSETTING RESIN COMPOSITION CONTAINING THE SAME, AND CURED PRODUCT OBTAINED THEREFROM

CROSS-REFERENCE TO RELATED APPLICATIONS

This is a continuation of Application PCT/JP2004/004680, filed Mar. 31, 2004, which was published under PCT Article 21(2).

BACKGROUND OF THE INVENTION

1. Field of the Invention

This invention relates to a linear, actinic energy ray-curable resin having a photopolymerizable unsaturated group and a carboxyl group, and more particularly to a linear, alkali-soluble, and actinic energy ray-curable resin containing regularly repeating cyclohexane rings.

This invention further relates to an alkali-developable, photocurable and thermosetting resin composition using the actinic energy ray-curable resin mentioned above and a cured product thereof, and more particularly relates to a liquid, alkali-developable, photocurable and thermosetting resin composition which is suitable for use in various applications, particularly for use as permanent masks for printed circuit boards, interlaminar insulating layers for multi-layer circuit boards, and the like and capable of forming a cured film exhibiting low dielectric properties and excelling in adhesiveness, resistance to electroless plating, electrical properties, flexibility, resistance to moisture absorption, and resistance to PCT (pressure cooker test) by means of a procedure comprising the steps of irradiating a coating film of the composition with actinic energy rays, then developing the exposed film with a dilute aqueous alkaline solution, thereby forming an image on the film, and finally curing the film by irradiation with actinic energy rays and subsequent heating, or by heating and subsequent irradiation with actinic energy rays, or by heating and to a cured film-forming technology using the composition mentioned above.

2. Description of the Prior Art

At present, as a solder resist for part of the household grade printed circuit boards and for virtually all the industrial grade printed circuit boards, a liquid developing type solder resist which is irradiated with ultraviolet light and then developed to form an image and thereafter finally cured (finish curing) by heating or exposure to light is adopted from the viewpoint of ensuring highly accurate formation of circuits with high density. Further, with due respect to the problem of environmental safety, the liquid solder resist of the alkali developing type which implements development with a dilute aqueous alkali solution as a developer has come to play the leading role. As such alkali developing type solder resists using a dilute aqueous alkali solution, for example, published Japanese Patent Application, JP 61-243869A discloses a solder resist composition comprising a photosensitive resin obtained by addition of an acid anhydride to the reaction product of a novolak type epoxy compound with an unsaturated monobasic acid, a photopolymerization initiator, a diluent, and an epoxy compound, and JP 3-253093A discloses a solder resist composition comprising a photosensitive resin obtained by addition of an acid anhydride to the reaction product of a novolak type epoxy compound with an unsaturated monobasic acid, a photopolymerization initiator, a diluent, a vinyltriazine or a mixture of vinyltriazine with dicyandiamide, and a melamine resin.

Although some material systems are heretofore proposed as a solder resist as mentioned above, a solder resist composition using mainly a photosensitive resin obtained by causing a polybasic acid anhydride to react with a reaction product of the above-mentioned novolak type epoxy resin and an unsaturated monobasic acid as a photosensitive component is currently used in large quantities in the practical manufacture of printed circuit boards. Although such a photosensitive resin is excellent in photocuring properties and alkali-developability, it is hardly possible to say that the above-mentioned resin has reached a satisfactory level in respect of the balance between the photocuring properties and the flexibility. Moreover, this resin has the drawback of being easy to generate cracks by the thermal shock according to the use aimed at because it tends to cause shrinkage during curing and exhibits low elongation and poor toughness.

Further, in view of high densification of the printed circuit board to cope with the recent trend of electronic devices toward decreasing weight and size, the desirability of producing the solder resist having high performance has been finding growing recognition. Moreover, the IC packages using a printed circuit board having the solder resist applied thereto and a sealing resin are recently used instead of the IC packages called QFP (quad flat-pack package), SOP (small outline package), etc. which use a lead frame and a sealing resin. These new packages have such structure that metals such as ball-like solder are arranged in an area on one side of a printed circuit board having the solder resist applied thereto, the IC chips are directly connected thereto on the other side by wire bonding or through the medium of the bumps etc., and they are sealed by a sealing resin. They are called by mnemonic names, such as BGA (ball grid array) and CSP (chip scale package). These packages have more pins than other packages such as QFP of the same size, but are easier to miniaturize. Moreover, also in mounting the devices, they realize a low percent defective owing to the self-alignment effect of ball-like solder, and the introduction of these packages is advanced quickly.

In the printed circuit boards having the heretofore commercially available alkali development type solder resist, however, the PCT resistance which is the long-term reliability test of a package was inferior, which resulted in exfoliation of a solder resist film. Moreover, another matter which came into question is the so-called popcorn phenomenon, i.e. the phenomenon that the absorbed moisture boils within the package during re-flow of the package at the step of mounting of devices and cracks occur in the solder resist film and the circumference thereof inside the package. Such drawbacks in resistance to moisture absorption and long-term reliability are undesirable not only in the case of the above-mentioned mounting technology but also in the products for other uses, such as a solder resist of a usual printed circuit board, a solder resist to be used in the manufacture of a flexible printed circuit board, and interlaminar insulating layers of multi-layer circuit boards like a build-up board.

SUMMARY OF THE INVENTION

An object of the present invention, therefore, is to provide an alkali-soluble and actinic energy ray-curable resin which is highly sensitive, abounds in flexibility, and exhibits the well-balanced flexibility and toughness.

A further object of the present invention is to provide a liquid, alkali-developable, photocurable and thermosetting resin composition capable of forming a cured film which keeps or improves such properties as low dielectric properties, adhesiveness, resistance to electroless plating, and electrical properties heretofore required of a solder resist of a printed circuit board and an interlaminar insulating layer of a multi-layer circuit board, particularly excels in such properties as resistance to moisture absorption and PCT (pressure cooker test) resistance required of an IC package, and capable of coping with high densification and surface mounting of a printed circuit board, and to provide a cured product obtained therefrom.

To accomplish the objects mentioned above, a first aspect of the present invention provides an actinic energy ray-curable resin obtained by reacting an unsaturated monocarboxylic acid (c) with a terminal epoxy group of an epoxy resin having an unsaturated group and a hydroxyl group in its side chains and an epoxy group in its terminal and further reacting a polybasic acid anhydride (d) with the hydroxyl group of the above-mentioned epoxy resin, wherein the above-mentioned epoxy resin is a product of the polyaddition reaction of a reaction product (I) of a polybasic acid anhydride (a) and a compound (b) having at least one unsaturated double bond and one alcoholic hydroxyl group in its molecule, a compound (II) having at least two carboxyl groups in its molecule, and a bifunctional epoxy compound (III), wherein at least either one of the carboxyl group-containing compound (II) and the bifunctional epoxy compound (III) mentioned above is a compound containing no aromatic ring.

In a preferred embodiment, the above-mentioned compound (II) having at least two carboxyl groups in its molecule is at least one compound selected from the group consisting of 1,2-cyclohexene dicarboxylic acid, tetrahydrophthalic acid, hexahydrophthalic acid, hexahydroisophthalic acid, and hexahydroterephthalic acid and containing no aromatic ring. Particularly preferred compound is cyclohexane dicarboxylic acid. In a further preferred embodiment, the above-mentioned bifunctional epoxy compound (III) is a hydrogenated bifunctional epoxy compound.

A second aspect of the present invention provides a photocurable and thermosetting resin composition capable of being developed with an aqueous alkaline solution, characterized by comprising (A) the actinic energy ray-curable resin mentioned above, (B) a photopolymerization initiator, (C) a diluent, and (D) a compound containing two or more epoxy groups and/or oxetanyl groups in its molecule (hereinafter referred to as "cyclic ether compound").

In accordance with a preferred embodiment, there is provided a photocurable and thermosetting resin composition further comprising (E) a curing catalyst besides the above-mentioned components. Further, there is provided a photocurable and thermosetting resin composition further comprising (F) another actinic energy ray-curable resin other than the actinic energy ray-curable resin mentioned above besides the above-mentioned components.

The actinic energy ray-curable resin of the present invention is a polybasic acid anhydride adduct of a linear epoxy acrylate compound of the alternating copolymerization type containing ester linkages therein, particularly a polybasic acid anhydride adduct of a linear epoxy acrylate compound containing repeating cyclohexane rings due to the use of a cyclohexane dicarboxylic acid as the compound having two carboxyl groups in its molecule and further containing ester linkages therein. Accordingly, it is photocurable and soluble in an alkaline solution, excels in photocuring properties with a low dose of irradiation, and has the well-balanced flexibility and toughness at a high level.

The photocurable and thermosetting resin composition of the present invention containing such an actinic energy ray-curable resin as a photocuring component, therefore, excels in the photocuring properties, the developing properties with an alkaline solution, and adhesiveness to a substrate and gives a cured product excelling in such properties as low dielectric properties, water resistance, resistance to electroless plating, resistance to chemicals, electrical insulating properties, flexibility, and PCT resistance.

Although the compounding ratios of the components are not limited to particular ones, it is desirable that the photopolymerization initiator (B) be in the range of 0.1 to 25 parts by weight, preferably 0.5 to 20 parts by weight, the diluent (C) be in the range of 10 to 60 parts by weight, preferably 15 to 50 parts by weight, the cyclic ether compound (D) be in the range of 10 to 100 parts by weight, and if need be, it is desirable to use (E) a curing catalyst in an amount of 0.1 to 20 parts by weight, respectively based on 100 parts by weight of the actinic energy ray-curable resin (A) mentioned above. Further, the composition may contain another actinic energy ray-curable resin (F) in place of part of the actinic energy ray-curable resin (A) mentioned above as occasion demands. In accordance with a preferred embodiment which gives lower dielectric properties, the composition may contain (G) a spherical porous filler having an average particle diameter of 1 to 10 μm. The composition may further contain (H) an epoxidized polybutadiene, (I) spherical urethane beads, etc. in amounts not so large as to impair the effects of the present invention.

The photocurable and thermosetting resin composition of the present invention may be used in the form of liquid or in the form of a dry film and may be advantageously usable in various fields, particularly in the formation of an interlaminar insulating layer and a solder resist layer for a printed circuit board.

Accordingly, in accordance with a third aspect of the present invention, there is provided a cured product obtained by curing the photocurable and thermosetting resin composition mentioned above by irradiation with actinic energy rays and/or heating. In accordance with its preferred embodiment, there is provided a printed circuit board having an interlaminar insulating layer and/or a solder resist layer formed from the photocurable and thermosetting resin composition mentioned above.

DETAILED DESCRIPTION OF THE PREFERRED EMBODIMENTS

The present inventors, after pursuing a diligent study to solve the problems mentioned above, have found that an actinic energy ray-curable resin obtained by using an epoxy resin having an unsaturated group and a hydroxyl group in its side chains, which is a product of the polyaddition reaction of a reaction product (I) of a polybasic acid anhydride (a) and a compound (b) having at least one unsaturated double bond and one alcoholic hydroxyl group in its molecule, a compound (II) having at least two carboxyl groups in its molecule, and a bifunctional epoxy compound (III), wherein at least either one of the carboxyl group-containing compound (II) and the bifunctional epoxy compound (III) mentioned above being a compound containing no aromatic ring, and reacting an unsaturated monocarboxylic acid (c) with a terminal epoxy group of the above-mentioned epoxy resin to introduce a photopolymerizable unsaturated group therein and further reacting a polybasic acid anhydride (d) with the hydroxyl group of the above-mentioned epoxy resin to introduce a carboxyl group therein, is high sensitive and even possesses toughness and further found that the photocurable and thermosetting resin composition containing such an actinic energy ray-curable resin as a photocuring component gives a cured product excelling in such properties as low dielectric properties, adhesiveness, resistance to electroless plating, electrical properties, flexibility, resistance to moisture absorption, and PCT (pressure cooker test) resistance. As a result, the present invention has been perfected.

Specifically, the actinic energy ray-curable resin of the present invention has a photopolymerizable unsaturated group introduced by reacting an unsaturated monocarboxylic acid with the epoxy resin mentioned above and a carboxyl group introduced by further reacting a polybasic acid anhydride therewith to impart photocuring properties and developing properties with an alkaline solution. Further, since the epoxy resin of its backbone polymer has the linear structure obtained by the polyaddition reaction of the above-mentioned components (I), (II) and (III), particularly the linear structure containing cyclohexane rings, its cured product excels in such properties as low dielectric properties, adhesiveness to a substrate, resistance to electroless plating, electrical properties, flexibility, resistance to moisture absorption, and PCT resistance.

Now, the actinic energy ray-curable resin of the present invention and the components of the photocurable and thermosetting composition containing it will be described in detail below. First, the actinic energy ray-curable resin of the present invention will be described below.

The actinic energy ray-curable resin of the present invention is produced by the following steps:

(1) synthesis of a reaction product (I) of a polybasic acid anhydride (a) and a compound (b) having at least one unsaturated double bond and one alcoholic hydroxyl group in its molecule, (2) synthesis of an epoxy resin having an unsaturated group and a hydroxyl group in its side chains, which is a product of the polyaddition reaction of the above-mentioned reaction product (I), a compound (II) having at least two carboxyl groups in its molecule, and a bifunctional epoxy compound (III), wherein at least either one of the carboxyl group-containing compound (II) and the bifunctional epoxy compound (III) mentioned above is a compound containing no aromatic ring, (3) synthesis of a polyfunctional acrylate resin by reacting an unsaturated monocarboxylic acid (c) with a terminal epoxy group of the above-mentioned epoxy resin having an unsaturated group and a hydroxyl group in its side chains, and (4) synthesis of an actinic energy ray-curable resin by reacting a polybasic acid anhydride (d) with a hydroxyl group of the polyfunctional acrylate resin mentioned above.

First, the synthesis of the reaction product (I) mentioned above will be described.

The reaction product (I) is obtained by carrying out the addition reaction of a polybasic acid anhydride (a) and a compound (b) having at least one unsaturated double bond and one alcoholic hydroxyl group in its molecule used as the raw materials under the reaction conditions to be described hereinafter. The reaction product (I) obtained may be represented by the following general formula (1), for example.

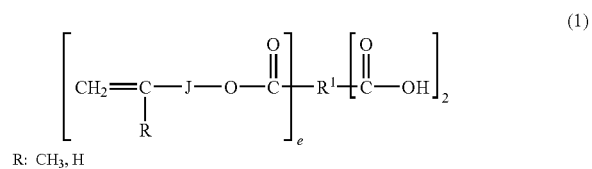

wherein $R^1$ represents a polybasic acid anhydride residue, "e" is an integer of 1 or 2, and "J" represents a structure originated from the compound (b) having at least one unsaturated double bond and one alcoholic hydroxyl group in its molecule to be described hereinbelow.

As the polybasic acid anhydride (a) mentioned above, dibasic acid anhydrides such as phthalic anhydride, succinic anhydride, maleic anhydride, tetrahydrophthalic anhydride, hexahydrophthalic anhydride, methyltetrahydrophthalic anhydride, 3,6-endomethylenetetrahydrophthalic anhydride, methylendomethylenetetrahydrophthalic anhydride, and tetrabromophthalic anhydride; tribasic acid anhydrides such as trimellitic anhydride; and aliphatic or aromatic tetrabasic acid dianhydrides such as biphenyl-tetracarboxylic dianhydride, naphthalene-tetracarboxylic dianhydride, diphenyl ether-tetracarboxylic dianhydride, butane-tetracarboxylic dianhydride, cyclopentane-tetracarboxylic dianhydride, pyromellitic anhydride, and benzophenone-tetracarboxylic dianhydride may be cited. Further, a modified product of trimellitic anhydride (a-1) represented by the following general formula (2), for example, may be cited.

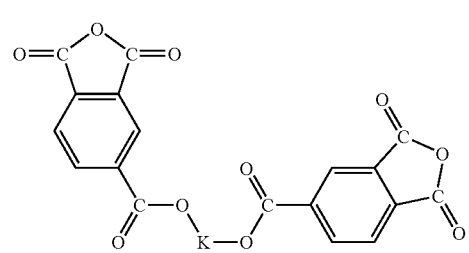

wherein "K" represents a glycol residue and is represented by the following general formula (3).

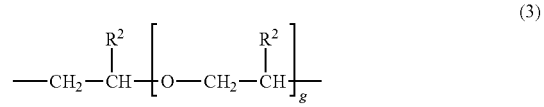

wherein $R^2$ represents a hydrogen atom or a methyl group and "g" is an integer of 0 or 1.

As the modified product of trimellitic anhydride (a-1), for example, condensation products of trimellitic anhydride with a glycol-based diol such as ethylene glycol, diethylene glycol, propylene glycol, and dipropylene glycol may be cited. As commercially available products, for example, TMEG-100, TMEG-200, TMEG-300, TMEG-500, TMTA-C, etc. manufactured by New Japan Chemical Co., Ltd. may be cited Among other reaction products, the reaction product of a tetrabasic acid anhydride or tribasic acid anhydride with the compound (b) mentioned above functions as a molecular chain extender in the polyaddition reaction to be described hereinafter and as an agent for introducing an unsaturated double bond of a side chain. On the other hand, the reaction product of a dibasic acid anhydride with the compound (b) mentioned above functions as a terminator of the molecular chain. It is possible to control the molecular weight of the resultant epoxy resin by using these reaction products as a mixture. The acid anhydrides may be used in the form of a combination of two or more members.

As the compound (b) having at least one unsaturated double bond and one alcoholic hydroxyl group in its molecule, hydroxyalkyl (meth)acrylates such as 2-hydroxyethyl (meth)acrylate, 2-hydroxypropyl (meth)acrylate, and 4-hydroxybutyl (meth)acrylate; diethylene glycol mono(meth)acrylate, dipropylene glycol mono(meth)acrylate, trimethylolpropane di(meth)acrylate, glycerine di(meth)acrylate, pentaerythritol tri(meth)acrylate, and dipentaerythritol penta(meth)acrylate may be cited. Further, the compounds obtained by adding a cyclic ester such as ∈-caprolactone to the hydroxyl group of the above mentioned compound may also be used. A preferred addition ratio of ∈-caprolactone is in the range of 1-2 mols based on 1 mol of the above-mentioned compound such as hydroxyalkyl (meth)acrylates. These compounds may be used either singly or in combination of two or more members. Incidentally, the term "(meth)acrylate" as used in this specification refers collectively to acrylate and methacrylate. This holds good for other similar expression.

In the reaction for synthesizing the reaction product (I) from the polybasic acid anhydride (a) and the compound (b) having at least one unsaturated double bond and one alcoholic hydroxyl group in its molecule, the compound (b) is used in an amount of 1.0 to 1.5 equivalents, preferably 1.0 to 1.2 equivalents per one equivalent of the polybasic acid anhydride (a). In the reaction a diluent (C) to be described hereinafter may be used. It is desirable that a catalyst be used to promote the reaction. Further, it is desirable that a thermal polymerization inhibitor be used for the purpose of preventing the thermal polymerization during the reaction. A suitable reaction temperature is in the approximate range of 60° C. to 150° C. and the reaction time is desired to be in the range of 5 to 60 hours.

In the reaction of the polybasic acid anhydride (a) with the compound (b), a tertiary amine, a tertiary amine salt, a quaternary onium salt, a tertiary phosphine, a phosphonium ylide, a crown ether complex, and an adduct of a tertiary amine or a tertiary phosphine with a carboxylic acid or a highly acidic phenol may be used as a reaction promotor. The amount of the promotor to be used is preferred to be in the range of 0.1 to 25 mol %, more preferably 0.5 to 20 mol %, most preferably 1 to 15 mol %, of the polybasic acid anhydride (a) mentioned above.

Although the aforementioned reaction proceeds either in the presence of an organic solvent or in the absence of a solvent, it is possible to improve the agitating effect during the reaction if the reaction is performed in the presence of an organic solvent (C-2) to be described hereinafter. In the above reaction, for the purpose of preventing the gelation caused by the polymerization of the unsaturated double bonds, it is possible to blow air into the reaction mixture or to add a polymerization inhibitor thereto. As the examples of the polymerization inhibitor, hydroquinone, toluquinone, methoxyphenol, phenothiazine, triphenyl antimony, copper chloride, etc. may be cited.

Next, the synthesis of the epoxy resin mentioned above will be described.

The epoxy resin having an unsaturated group and a hydroxyl group in its side chains may be obtained by using the above-mentioned reaction product (I), a compound (II) having at least two carboxyl groups in its molecule, and a bifunctional epoxy compound (III) as raw materials, wherein at least either one of the carboxyl group-containing compound (II) and the bifunctional epoxy compound (III) mentioned above is a compound containing no aromatic ring, and alternately polymerize them in the presence of a known catalyst to be described hereinafter. The resultant epoxy resin may be represented by the following general formula (4), for example.

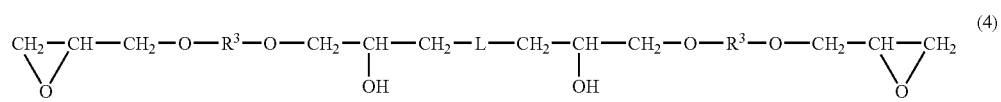
(4)

wherein $R^3$ represents a structure originated from the bifunctional epoxy compound to be described hereinafter, and "L" represents a structure originated from the linkages of the aforementioned raw materials (I) and/or (II) and/or (III) and represented by the following general formulas (5), (6), and (7). The recurring moiety units of the following general formulas (5), (6), and (7) are randomly bonded to each other and at least one of each unit is contained in the resin. Further, a moiety unit represented by the following general formula (8) is always bonded between the moiety units (5), (6), and (7) severally.

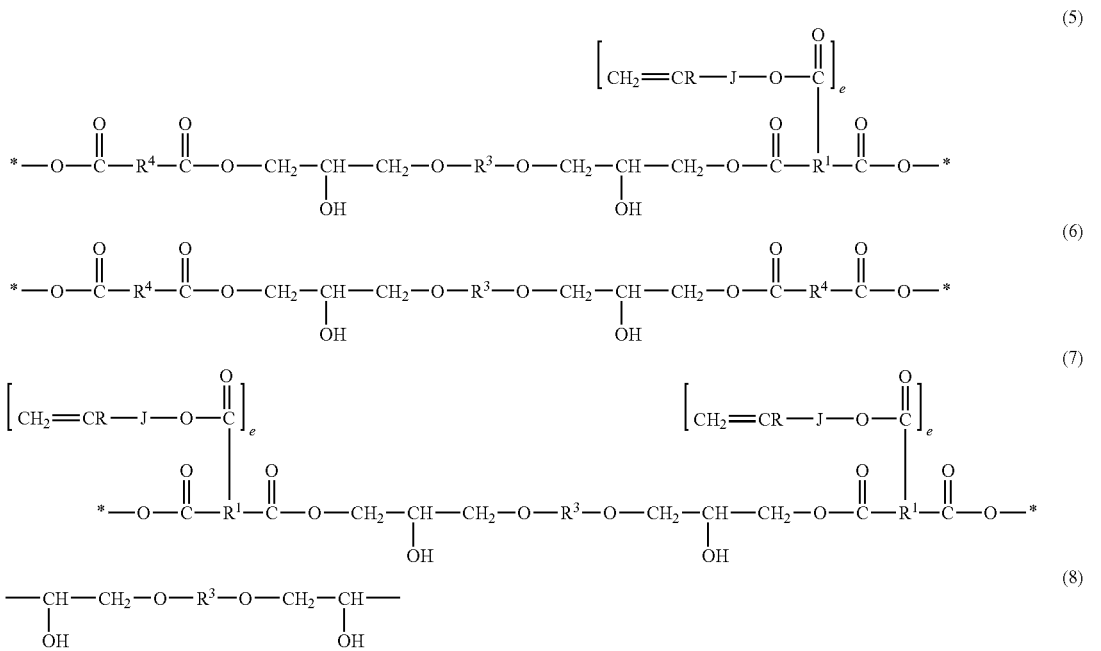

wherein $R^1$ and $R^3$ have the same meanings as those mentioned above, $R^4$ represents a dicarboxylic acid residue, and "e" is an integer of 1 or 2.

As concrete examples of the above-mentioned compound (II) having at least two carboxyl groups in its molecule, 1,2-cyclohexene dicarboxylic acid, tetrahydrophthalic acid, hexahydrophthalic acid, hexahydroisophthalic acid, hexahydroterephthalic acid, phthalic acid, isophthalic acid, terephthalic acid, succinic acid, adipic acid, muconic acid, suberic acid, etc. may be cited. These compounds may be used either singly or in combination of two or more members.

As the bifunctional epoxy compound (III), bisphenol A type epoxy resins, bisphenol F type epoxy resins, bixylenol type or biphenol type epoxy resins or mixtures thereof, bisphenol S type epoxy resins, etc. may be cited. Among other epoxy resins enumerated above, hydrogenated bifunctional epoxy compounds prove to be desirable.

As the hydrogenated bifunctional epoxy compounds (III), for example, hydrogenated products of the following epoxy resins may be cited; bisphenol A type epoxy resins represented by EPIKOTE 828, EPIKOTE 834, EPIKOTE 1001, and EPIKOTE 1004 produced by Japan Epoxy Resin K.K., EPICLON 840, EPICLON 850, EPICLON 1050, and EPICLON 2055 produced by Dainippon Ink and Chemicals Inc., Epo Tohto YD-011, YD-013, YD-127, and YD-128 produced by Tohto Kasei Co., Ltd., D.E.R. 317, D.E.R. 331, D.E.R. 661, and D.E.R. 664 produced by The Dow Chemical Company, ARALDITE 6071, ARALDITE 6084, ARALDITE GY250, and ARALDITE GY260 produced by Ciba Specialty Chemicals Inc., Sumi-epoxy ESA-011, ESA-014, ELA-115, and ELA-128 produced by Sumitomo Chemical Co., Ltd., and A.E.R. 330, A.E.R. 331, A.E.R. 661, and A.E.R. 664 produced by Asahi Chemical Industry Co., Ltd. (all trade names); bisphenol F type epoxy resins represented by EPICLON 830 produced by Dainippon Ink and Chemicals Inc., EPIKOTE 807 produced by Japan Epoxy Resin K.K., Epo Tohto YDF-170, YDF-175, and YDF-2004 produced by Tohto Kasei Co., Ltd., and ARALDITE XPY306 produced by Ciba Specialty Chemicals Inc. (all trade names), bixylenol type or biphenol type epoxy resins or mixtures thereof represented by YL-6056, YX-4000, and YL-6121 produced by Japan Epoxy Resin K.K. (all trade names); and bisphenol S type epoxy resins represented by EBPS-200 produced by Nippon Kayaku Co., Ltd., EPX-30 produced by Asahi Denka Kogyo K.K., and EXA-1514 produced by Dainippon Ink and Chemicals Inc. (all trade names). Among other epoxy resins enumerated above, hydrogenated bisphenol A type epoxy resins prove to be desirable. As concrete examples thereof, those produced by Japan Epoxy Resin K.K. under the product name of EPIKOTE YL-6663, and those produced by Tohto Kasei Co., Ltd. under the product names of Epo Tohto ST-2004, Epo Tohto ST-2007, and Epo Tohto ST-3000, etc. may be cited. The hydrogenation ratio of the epoxy compound is preferred to be in the range of 0.1% to 100%. The partially hydrogenated epoxy compounds and the completely hydrogenated epoxy compounds as represented by the following general formulas (9) may be used. In general, when an epoxy compound having an aromatic ring is used, the sensitivity of the resultant photocurable and thermosetting resin composition will tend to become low due to absorption of light in the aromatic ring during exposure to light. However, the hydrogenation will give the effects of improving the sensitivity and also improving the resistance to electroless plating, as being clear from the Examples to be described hereinafter.

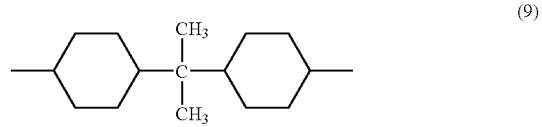

(9)

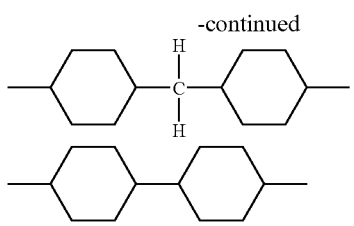

The bifunctional epoxy compounds (III) mentioned above may be used either singly or in the form of a combination of two or more members.

Although the above-mentioned compound (II) having at least two carboxyl groups in its molecule is not limited to a particular one, a particularly preferred embodiment is the case that $R^4$ in the general formulas (5) and (6) mentioned above is a cyclohexane ring. When this compound is copolymerized with a hydrogenated bisphenolic A type epoxy compound which is a preferred one as the other monomer component (III), the resultant resin is a linear epoxy resin of the alternating copolymerization type containing regularly repeating cyclohexane rings, which excels in photocuring properties and gives a cured product having the well-balanced toughness and flexibility at a higher level.

As the catalyst to be used for the reaction of the above-mentioned reaction product (I), the compound (II) having at least two carboxyl groups in its molecule, and the bifunctional epoxy compound (III), it is desirable to use such catalysts as phosphines, alkali metal compounds, and amines, by which the epoxy group reacts with the carboxyl group quantitatively, either singly or in the form of a combination of two or more members. The use of other catalysts is not desirable because a monomer component reacts with an alcoholic hydroxyl group caused by the reaction of the epoxy group with the carboxyl group to give rise gelation.

As the phosphines, trialkyl or triaryl phosphines such as tributylphosphine and triphenylphosphine, salts thereof with an oxide, etc. may be cited. They may be used either singly or in the form of a combination of two or more members.

As the alkali metal compounds, hydroxides, halides, alcoholates, amides, etc. of alkali metals such as sodium, lithium, and potassium may be cited. These compounds may be used either singly or in the form of a combination of two or more members.

As the amines, aliphatic or aromatic primary, secondary, tertiary, and quaternary amines may be cited. These amines may be used either singly or in the form of a combination of two or more members. As concrete examples of the amines, triethanolamine, N,N-dimethylpiperazine, triethylamine, tri-n-propylamine, hexamethylenetetramine, pyridine, tetrametylammonium bromide, etc. may be cited.

The amount of the catalyst to be used is preferred to be in the range of 0.1 to 25 mol %, preferably 0.5 to 20 mol %, more preferably 1 to 15 mol %, based on one mol of the epoxy group of the bifunctional epoxy compound (III). This is because if the amount of the catalyst to be used is less than 0.1 mol % of the epoxy group, the reaction will take much time uneconomically. Conversely, a large amount exceeding 25 mol % is not desirable from the reason that the reaction speed becomes rapid uncontrollably.

When the amounts of the above-mentioned reaction product (I), the compound (II) having at least two carboxyl groups in its molecule, and the bifunctional epoxy compound (III) to be used in the polyaddition reaction is assumed to be $\alpha$ mol, $\beta$ mol, and $\gamma$ mol, respectively, their amounts will be so adjusted as to be $\gamma/(\alpha+\beta)>1$, $\alpha\beta\neq 0$. That is, the bifunctional epoxy compound (III) is used in an excess amount and thus the resultant epoxy resin of the linear structure is possessed of epoxy groups in its both ends.

The polyaddition reaction of the above-mentioned reaction product (I), the compound (II) having at least two carboxyl groups in its molecule, and the bifunctional epoxy compound (III) is preferred to be carried out in an stream of an inert gas or in the air in the presence of a catalyst mentioned above at a temperature in the approximate range of 50 to 200° C., preferably in the approximate range of 80 to 150° C. If the reaction temperature is lower than 50° C., the reaction will not proceed to a satisfactory extent. Conversely, the reaction temperature exceeding 200° C. is not desirable from the reason that the by-reaction of hydroxyl groups of the resultant product with epoxy groups will proceed and the product will tend to cause gelation. Although the reaction time may be suitably selected depending on the reactivity of the raw materials to be used and the reaction temperature, the preferred reaction time is about 5-72 hours.

Then, the synthesis of the polyfunctional acrylate resin will be described.

The polyfunctional acrylate resin of the present invention can be produced by causing the reaction of an unsaturated monocarboxylic acid (c) with the epoxy resin of the linear structure obtained as described above in the presence of an organic solvent to be described hereinafter or in the absence of a solvent and also in the presence of a polymerization inhibitor such as hydroquinone and oxygen in combination with a reaction catalyst such as a tertiary amine like triethylamine, a quaternary ammonium salt like triethylbenzyl ammonium chloride, an imidazole compound like 2-ethyl-4-methylimidazole, and a phosphorus compound like triphenylphosphine, usually at a temperature in the approximate range of 80 to 130° C.

When acrylic acid, for example, as the unsaturated monocarboxylic acid (c) is caused to react with the epoxy resin as represented by the general formula (4) mentioned above, a polyfunctional acrylate resin represented by the following general formula (10) may be obtained.

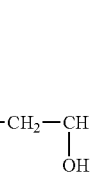 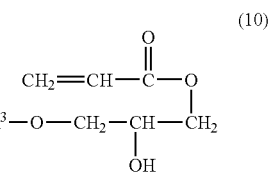

(10)

wherein "L" and $R^3$ have the same meanings as those mentioned above.

The production of the polyfunctional acrylate resin by reacting the unsaturated monocarboxylic acid (c) with the epoxy resin mentioned above can be performed by compounding the unsaturated monocarboxylic acid (c) with the epoxy resin mentioned above in a proportion of 0.2 to 1.3 mols, based on one mol of the epoxy group contained in the epoxy resin, and heating the mixture to a temperature in the approximate range of 60 to 150° C., preferably in the range of 70 to 130° C., in the presence of a solvent or in the absence of a solvent, preferably in the presence of air, to effect the reaction. In order to prevent the gelation caused by the polymerization during the reaction, it is preferred to use a well-known and widely used polymerization inhibitor such as hydroquinones like methylhydroquinone and hydroquinone, and benzoquinones like p-benzoquinone and p-toluquinone. Further, for the purpose of shortening the reaction time, it is preferred to use an esterification catalyst.

As the esterification catalyst, any well-known and widely used catalysts such as tertiary amines like N,N-dimethylaniline, pyridine, and triethylamine and their hydrochlorides or hydrobromides; quaternary ammonium salts like tetramethyl ammonium chloride and triethylbenzyl ammonium chloride; sulfonic acids like p-toluenesulfonic acid; sulfonium salts like dimethyl sulfoxide and methyl sulfoxide; phosphines like triphenylphosphine and tri-n-butylphosphine; and metal halides like lithium chloride, lithium bromide, stannous chloride, and zinc chloride may be used.

As a solvent, it is desirable to use an inert solvent. As the inert solvent, for example, toluene, xylene, etc. may be used.

As typical examples of the unsaturated monocarboxylic acid (c) mentioned above, acrylic acid, methacrylic acid, cinnamic acid, crotonic acid, sorbic acid, α-cyanocinnamic acid, β-styrylacrylic acid, and unsaturated dibasic acid anhydride adducts of a hydroxyl group-containing acrylate such as hydroxyethyl (meth)acrylate, hydroxypropyl (meth)acrylate, hydroxybutyl (meth)acrylate, trimethylol propane di(meth) acrylate, pentaerythritol tri(meth)acryalte, dipentaerythritol penta(meth)acrylate, phenyl glycidyl (meth)acrylate, and caprolactone adduct of (meth)acrylic acid may be cited. Among other unsaturated monocarboxylic acids (c) cited above, acrylic acid and methacrylic acid prove to be particularly desirable. These unsaturated monocarboxylic acids may be used either singly or in the form of a combination of two or more members.

Next, the synthesis of the actinic energy ray-curable resin (A) of the present invention will be described.

The actinic energy ray-curable resin (A) of the present invention is obtained by reacting a polybasic acid anhydride (d) with an alcoholic hydroxyl group of the polyfunctional acrylate resin produced by the reaction mentioned above. In this reaction, the amount of the polybasic acid anhydride (d) to be used is preferred to be in such a ratio that the anhydride group should be 0.1 to 1 mol based on one mole of the alcoholic hydroxyl group of the polyfunctional acrylate resin mentioned above, preferably in such an addition ratio that the acid value of the produced actinic energy ray-curable resin falls in the range of 50 to 200 mg KOH/g, preferably 50 to 120 mg KOH/g. If the acid value of the actinic energy ray-curable resin is less than 50 mg KOH/g, the resultant product will manifest insufficient solubility in an aqueous alkaline solution and the coating film formed therefrom will be developed only with difficulty. Conversely, the acid value exceeding 200 mg KOH/g is not preferred from the reason that the coating film will be developed even in the surface of the exposed portion without reference to the conditions of the exposure.

When the polybasic acid anhydride (d) is caused to react with the polyfunctional acrylate resin as represented by the general formula (10) mentioned above, for example, the actinic energy ray-curable resin as represented by the following general formula (11) may be obtained.

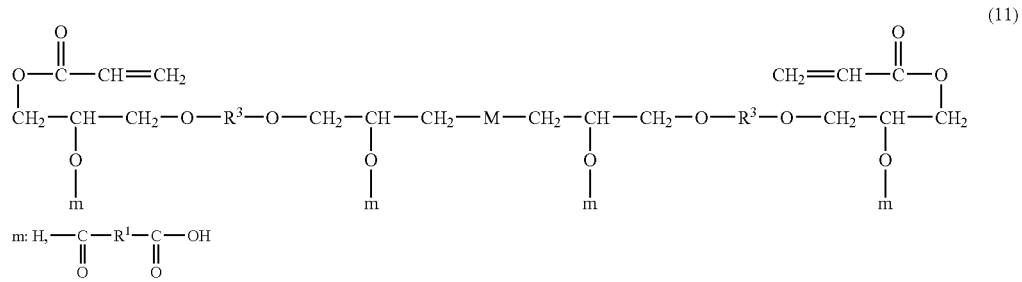

wherein $R^1$ and $R^3$ have the same meanings as those mentioned above and "M" has the moiety units represented by the following general formulas (12), (13), and (14). The recurring moiety units of the following general formulas (12), (13), and (14) are randomly bonded to each other. Further, a moiety unit represented by the following general formula (15) is always bonded between the moiety units (12), (13), and (14) severally. The groups "m" can be adjusted by the degree of reaction of the polybasic acid anhydride.

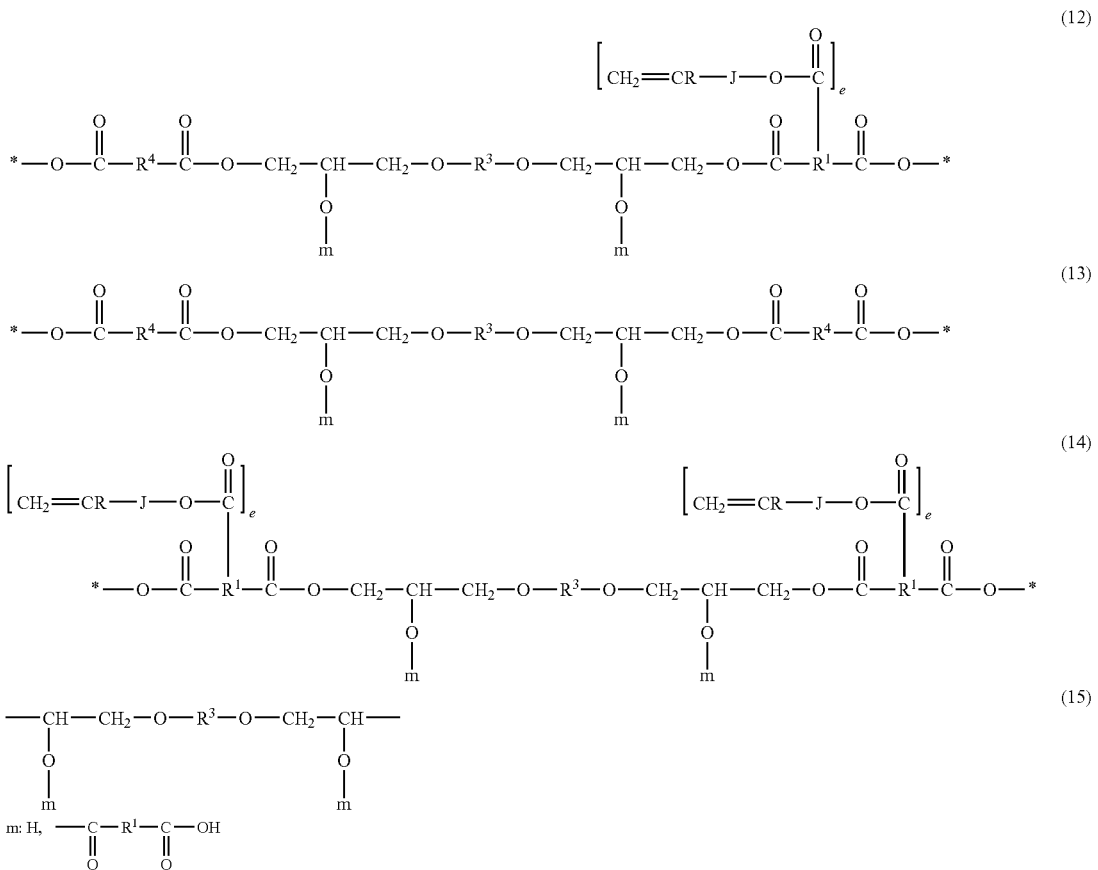

wherein "J", $R^1$, $R^3$, $R^4$, and "e" have the same meanings as those mentioned above.

The above-mentioned reaction is carried out usually at a temperature in the approximate range of 50 to 130° C. in the presence of an organic solvent to be described hereinafter or in the absence of a solvent and also in the presence of a polymerization inhibitor such as hydroquinone and oxygen. In this reaction, as occasion demands, a tertiary amine such as triethylamine, a quaternary ammonium salt such as triethylbenzyl ammonium chloride, an imidazole compound such as 2-ethyl-4-methylimidazole, and a phosphorus compound such as triphenylphosphine may be added as a catalyst.

As the polybasic acid anhydride (d) mentioned above, alicyclic dibasic acid anhydrides such as methyltetrahydrophthalic anhydride, tetrahydrophthalic anhydride, hexahydrophthalic anhydride, methylhexahydrophthalic anhydride, nadic anhydride, 3,6-endomethylenetetrahydrophthalic anhydride, methylendomethylenetetrahydrophthalic anhydride, and tetrabromophthalic anhydride; aliphatic or aromatic, dibasic or tribasic acid anhydrides such as succinic anhydride, maleic anhydride, itaconic anhydride, octenylsuccinic anhydride, pentadodecenylsuccinic anhydride, phthalic anhydride, and trimellitic anhydride; and aliphatic or aromatic tetrabasic acid dianhydrides such as biphenyl-tertacarboxylic dianhydride, diphenyl ether-tetracarboxylic dianhydride, butane-tetracarboxylic dianhydride, cyclopentane-tetracarboxylic dianhydride, pyromellitic anhydride, and benzophenone-tetracarboxylic dianhydride may be cited.

These polybasic acid anhydrides may be used either singly or in the form of a combination of two or more members. Among other polybasic acid anhydrides cited above, alicyclic dibasic acid anhydrides prove to be particularly desirable.

The actinic energy ray-curable resin (A) of the present invention has a number-average molecular weight in the range of 400 to 100,000, preferably 900 to 20,000, more preferably 900 to 10,000. If the number-average molecular weight of the actinic energy ray-curable resin is lower than 400, a cured product obtained therefrom will exhibit insufficient toughness. Conversely, if the number-average molecular weight exceeds 100,000, the cured product will be at a disadvantage in exhibiting poor developing properties.

As the photopolymerization initiator (B) mentioned above, for example, benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinopropanone-1,2-benzyl-2-dimethylamino-1-(4-morpholinophenyl)-butan-1-one, and N,N-dimethylaminoacetophenone; anthraquinones such as 2-methylanthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; organic peroxides such as benzoyl peroxide and cumene peroxide; dimer of 2,4,5-triaryl imidazole, riboflavin tetrabutylate; thiol compounds such as 2-mercaptobenzimidazole, 2-mercaptobenzoxazole, and 2-mercaptobenzothiazole; 2,4,6-tris-S-triazine; organic halogen compounds such as 2,2,2-tribromoethanol and tribromomethyl phenyl sulfone; benzophenones such as benzophenone and 4,4'-bis(diethylamino)benzophenone or xanthones; 2,4,6-trimethylbenzoyl diphenylphosphine oxide etc. may be cited. These well-known and widely used photopolymerization initiators may be used either singly or in the form of a mixture of two or more members, or further in combination with a photo-initiator aid such as tertiary amines like N,N-(dimethylamino)ethylbenzoate, N,N-(dimethylamino)isoamylbenzoate, penthyl-4-dimethylaminobenzoate, triethyl amine, and triethanol amine. Further, a titanothene compound such as CGI-784 (product of Ciba Specialty Chemicals Inc.) and the like which exhibit absorption in a visible region may be added to promote the photochemical reaction. Particularly preferred photopolymerization initiator is 2-methyl-1-[4-(methylthio)phenyl]-2-morpholinopropanone-1,2-benzyl-2-dimethylamino-1-(4-morpholinophenyl)-butan-1-one, etc., but not limited to these compounds. Any compounds which absorb light in the ultraviolet region or visible region and cause radical polymerization of the unsaturated groups such as (meth)acryloyl groups may be used either singly or in the form of a combination of two or more members irrespective of the photopolymerization initiator or the photo-initiator aid.

The amount of the photopolymerization initiator (B) (in case the photo-initiator aid is used, the total amount thereof) to be used is preferred to be in the range of 0.1 to 25 parts by weight, preferably 0.5 to 20 parts by weight, based on 100 parts by weight of the aforementioned actinic energy ray-curable resin (A) (as a solid content, this holds good for the same expression to be described hereinafter). If the amount of the photopolymerization initiator to be used is less than the lower limit of the range mentioned above, the composition will not be cured by irradiation of actinic energy rays or the irradiation time should be prolonged, and a coating film of satisfactory properties will be obtained only with difficulty. Conversely, even if the photopolymerization initiator is added to the composition in a large amount exceeding the upper limit of the range mentioned above, the composition will not attain the further improvement in the photocuring properties and such a large amount is not desirable from the economical viewpoint.

As the diluent (C) mentioned above, a photopolymerizable vinyl monomer (C-1) and/or an organic solvent (C-2) may be used.

As the typical examples of the photopolymerizable vinyl monomer (C-1), hydroxyalkyl acrylates such as 2-hydroxyethyl acrylate and 2-hydroxypropyl acrylate; mono- or diacrylates of glycols such as ethylene glycol, methoxytetraethylene glycol, polyethylene glycol, and propylene glycol; acrylamides such as N,N-dimethyl acrylamide, N-methylol acrylamide, and N,N-dimethylaminopropyl acrylamide; aminoalkyl acrylates such as N,N-dimethylaminoethyl acrylate and N,N-dimethylaminopropyl acrylate; polyfunctional acrylates of polyhydric alcohols such as hexane diol, trimethylol propane, pentaerythritol, dipentaerythritol, and tris-hydroxyethyl isocyanurate, and ethylene oxide adducts or propylene oxide adducts of these polyhydric alcohols; phenoxy acrylate, bisphenol A diacrylate and acrylates of ethylene oxide adducts or propylene oxide adducts of these phenols; acrylates of glycidyl ethers such as glycerin diglycidyl ether, glycerin triglycidyl ether, trimethylol propane triglycidyl ether, and triglycidyl isocyanurate; melamine acrylate; and methacrylates corresponding to the acrylates mentioned above may be cited.

As the organic solvent (C-2) mentioned above, ketones such as methyl ethyl ketone and cyclohexanone; aromatic hydrocarbons such as toluene, xylene, and tetramethyl benzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; esters such as ethyl acetate, butyl acetate, and acetates of glycol ethers mentioned above; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha may be cited. Among other solvents cited above, those which exhibit good compatibility with the actinic energy ray-curable resin (A) mentioned above and do not dissolve a cyclic ether compound (D) as a thermosetting component therein prove to be desirable.

The diluents (C) mentioned above may be used either singly or in the form of a mixture of two or more members. The amount of the diluent to be used, when the photopolymerizable vinyl monomer is used, is desired to fall in the range of 10 to 60 parts by weight, preferably 15 to 50 parts by weight, based on 100 parts by weight of the actinic energy ray-curable resin (A). The amount of the photopolymerizable vinyl monomer larger than the upper limit of the range mentioned above is not desirable because a tack-free touch of finger of a coating film will be impaired. Though the amount of the organic solvent to be used is not particularly restricted, it is properly in the approximate range of 30 to 300 parts by weight, based on 100 parts by weight of the actinic energy ray-curable resin (A) mentioned above. The amount of the organic solvent may be suitably set so as to fit the method of application to be selected.

With respect to the purpose of use of the diluent (C) mentioned above, the photopolymerizable vinyl monomer (C-1) is used for the purpose of diluting the photosenstive components thereby rendering the produced composition easily applicable, and improving the photopolymerizability of the composition. On the other hand, the organic solvent (C-2) is used for the purpose of dissolving the photosensitive components, diluting the composition, allowing the composition to be applied in the from of a liquid, enabling the applied layer of the composition to form a film by drying, and allowing the film to be exposed to light by the contact exposure. Accordingly, either exposure method of the contact exposure method in which a photomask is closely superposed on a coating film or the non-contact exposure method is used depending on the diluent to be used.

As the cyclic ether compound (D) mentioned above, a polyfunctional epoxy compound (D-1) and/or a polyfunctional oxetane compound (D-2) may be used.

Concrete examples of the polyfunctional epoxy compound (D-1) include bisphenol A type epoxy resins represented by EPIKOTE 828, EPIKOTE 834, EPIKOTE 1001, and EPIKOTE 1004 produced by Japan Epoxy Resin K.K., EPICLON 840, EPICLON 850, EPICLON 1050, and EPICLON 2055 produced by Dainippon Ink and Chemicals Inc., Epo Tohto YD-011, YD-013, YD-127, and YD-128 produced by Tohto Kasei Co., Ltd., D.E.R. 317, D.E.R. 331, D.E.R. 661, and D.E.R. 664 produced by The Dow Chemical Company, ARALDITE 6071, ARALDITE 6084, ARALDITE GY250, and ARALDITE GY260 produced by Ciba Specialty Chemicals Inc., Sumi-epoxy ESA-011, ESA-014, ELA-115, and ELA-128 produced by Sumitomo Chemical Co., Ltd., and A.E.R. 330, A.E.R. 331, A.E.R. 661, and A.E.R. 664 produced by Asahi Chemical Industry Co., Ltd. (all trade names); brominated epoxy resins represented by EPIKOTE YL903 produced by Japan Epoxy Resin K.K., EPICLON 152 and EPICLON 165 produced by Dainippon Ink and Chemicals Inc., Epo Tohto YDB-400 and YDB-500 produced by Tohto Kasei Co., Ltd., D.E.R. 542 produced by The Dow Chemical Company, ARALDITE 8011 produced by Ciba Specialty Chemicals Inc., Sumi-epoxy ESB-400 and ESB-700 produced by Sumitomo Chemical Co., Ltd., and A.E.R. 711 and A.E.R. 714 produced by Asahi Chemical Industry Co., Ltd. (all trade names); novolak type epoxy resins represented by EPIKOTE 152 and EPIKOTE 154 produced by Japan Epoxy Resin K.K., D.E.N. 431 and D.E.N. 438 produced by The Dow Chemical Company, EPICLON N-730, EPICLON N-770, and EPICLON N-865 produced by Dainippon Ink and Chemicals Inc., Epo Tohto YDCN-701 and YDCN-704 produced by Tohto Kasei Co., Ltd., ARALDITE ECN1235, ARALDITE ECN1273, ARALDITE ECN1299, and ARALDITE XPY307 produced by Ciba Specialty Chemicals Inc., EPPN-201, EOCN-1025, EOCN-1020, EOCN-104S, and RE-306 produced by Nippon Kayaku Co., Ltd., Sumi-epoxy ESCN-195X and ESCN-220 produced by Sumitomo Chemical Co., Ltd., and A.E.R. ECN-235 and ECN-299 produced by Asahi Chemical Industry Co., Ltd. (all trade names); bisphenol F type epoxy resins represented by EPICLON 830 produced by Dainippon Ink and Chemicals Inc., EPIKOTE 807 produced by Japan Epoxy Resin K.K., Epo Tohto YDF-170, YDF-175, and YDF-2004 produced by Tohto Kasei Co., Ltd., and ARALDITE XPY306 produced by Ciba Specialty Chemicals Inc. (all trade names); hydrogenated bisphenol A type epoxy resins represented by Epo Tohto ST-2004, ST-2007, and ST-3000 produced by Tohto Kasei Co., Ltd. (all trade names); glycidylamine type epoxy resins represented by EPIKOTE 604 produced by Japan Epoxy Resin K.K., Epo Tohto YH-434 produced by Tohto Kasei Co., Ltd., ARALDITE MY720 produced by Ciba Specialty Chemicals Inc., and Sumi-epoxy ELM-120 produced by Sumitomo Chemical Co., Ltd. (all trade names); hydantoin type epoxy resins such as ARALDITE CY-350 produced by Ciba Specialty Chemicals Inc. (trade name); alicyclic epoxy resins represented by Celloxide 2021 produced by Daicel Chemical Industries, Ltd., and ARALDITE CY175 and CY179 produced by Ciba Specialty Chemicals Inc. (all trade names); trihydroxyphenyl methane type epoxy resins represented by YL-933 produced by Japan Epoxy Resin K.K., T.E.N. produced by The Dow Chemical Company, and EPPN-501 and EPPN-502 produced by Nippon Kayaku Co., Ltd. (all trade names); bixylenol type or biphenol type epoxy resins or mixtures thereof represented by YL-6056, YX-4000, and YL-6121 produced by Japan Epoxy Resin K.K. (all trade names); bisphenol S type epoxy resins represented by EBPS-200 produced by Nippon Kayaku Co., Ltd., EPX-30 produced by Asahi Denka Kogyo K.K., and EXA-1514 produced by Dainippon Ink and Chemicals Inc. (all trade names); bisphenol A novolak type epoxy resins represented by EPIKOTE 157S (trade name) produced by Japan Epoxy Resin K.K.; tetraphenylol ethane type epoxy resins represented by EPIKOTE YL-931 produced by Japan Epoxy Resin K.K., and ARALDITE 163 produced by Ciba Specialty Chemicals Inc. (all trade names); heterocyclic epoxy resins represented by ARALDITE PT810 produced by Ciba Specialty Chemicals Inc. and TEPIC produced by Nissan Chemical Industries Ltd. (all trade names); diglycidyl phthalate resin represented by BLEMMER DGT (trade name) produced by Nippon Oil and Fats Co., Ltd.; tetraglycidyl xylenoyl ethane resins represented by ZX-1063 (trade name) produced by Tohto Kasei Co., Ltd.; naphthalene group-containing epoxy resins represented by ESN-190 and ESN-360 produced by Shinnittetsu Chemical Co., Ltd. and HP-4032, EXA-4750, and EXA-4700 produced by Dainippon Ink and Chemicals Inc. (all trade names); dicyclopentadiene skeleton-containing epoxy resins represented by HP-7200 and HP-7200H produced by Dainippon Ink and Chemicals Inc. (all trade names); glycidylmethacrylate copolymer type epoxy resins represented by CP-50S and CP-50M produced by Nippon Oil and Fats Co., Ltd. (all trade names); and copolymeric epoxy resin of cyclohexylmaleimide and glycidyl methacrylate, but are not limited to these epoxy resins. These epoxy resins may be used either singly or in the form of a combination of two or more members. Among other epoxy resins cited above, biphenol type or bixylenol type epoxy resins or mixtures thereof prove to be particularly desirable.

Of the polyfunctional oxetane compounds (D), as typical examples of the compound containing two oxetanyl groups in its molecule (hereinafter referred to briefly as "bisoxetane"), bisoxetanes represented by the following general formula (16) may be cited.

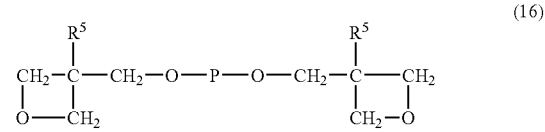

(16)

In the above general formula (16), $R^5$ represents a hydrogen atom or an alkyl group of 1 to 6 carbon atoms, and "P" represents a bivalent group selected from among linear or branched saturated hydrocarbons of 1 to 12 carbon atoms, linear or branched unsaturated hydrocarbons of 2 to 12 carbon atoms, aromatic hydrocarbons represented by the following formulas (17), (18), (19), (20), and (21), linear or cyclic alkylene groups containing a carbonyl group and represented by the following formulas (22) and (23), and aromatic hydrocarbons containing a carbonyl group and represented by the following formulas (24) and (25).

(17)

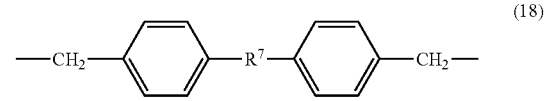

(18)

(19)

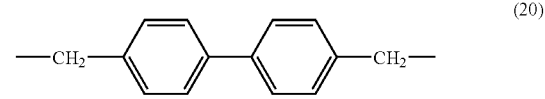

(20)

-continued

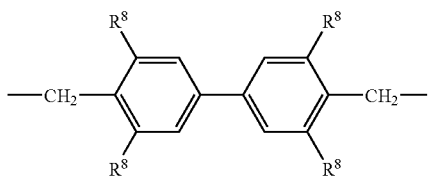
(21)

wherein $R^6$ represents a hydrogen atom, an alkyl group of 1 to 12 carbon atoms, an aryl group, or an aralkyl group, $R^7$ represents —O—, —S—, —CH$_2$—, —NH—, —SO$_2$—, —CH(CH$_3$)—, —C(CH$_3$)$_2$—, or —C(CF$_3$)$_2$—, and $R^8$ represents a hydrogen atom or an alkyl group of 1 to 6 carbon atoms.

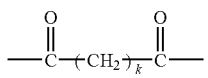
(22)

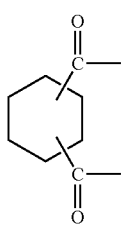
(23)

wherein "k" is an integer of 1 to 12.

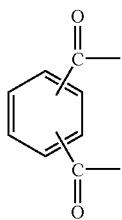
(24)

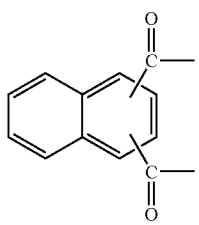
(25)

As typical examples of the polyfunctional oxetane compound (D-2) to be used in the present invention, a compound containing three oxetanyl groups in its molecule may be used besides the compounds containing two oxetanyl groups in its molecule enumerated above, such as bisoxetanes represented by the aforementioned general formula (16).

As typical examples of the compound containing three or more oxetanyl groups in its molecule, the compounds represented by the following general formula (26) may be cited.

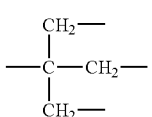
(26)

wherein $R^9$ represents a hydrogen atom or an alkyl group of 1 to 6 carbon atoms, "Q" represents a branched alkylene group of 1 to 12 carbon atoms represented by the following formula (27), (28) or (29), or an aromatic hydrocarbon represented by the following formula (30), (31) or (32), and "l" represents the number of functional groups bonded to the residue "Q", an integer of three or more, preferably an integer of 3 to 5,000.

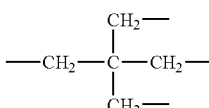
(27)

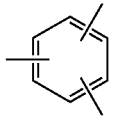
(28)

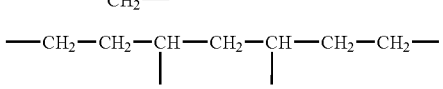
(29)

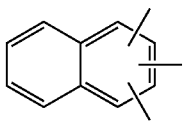
(30)

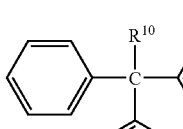
(31)

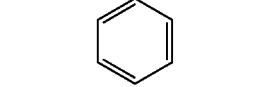
(32)

wherein $R^{10}$ represents a hydrogen atom, an alkyl group of 1 to 6 carbon atoms, or an aryl group.

As the compound containing three or more oxetanyl groups in its molecule, etherified products of an oxetane with a hydroxyl group-containing resin, such as a novolak resin, poly(p-hydroxystyrene), cardo type bisphenols, calixarenes, calixresorcinarenes, and a cylseskioxane, besides the compounds mentioned above may be cited. In addition thereto, a copolymer of an unsaturated monomer containing an oxetane ring and an alkyl (meth)acrylate may be cited.

The oxetane compounds (D-2) mentioned above may be used either singly or in the form of a combination of two or more members.

The cyclic ether compound (D) mentioned above contributes to the improvement in such properties as adhesiveness and heat resistance of a solder resist through its thermal cure. The sufficient amount of the cyclic ether compound to be incorporated in the composition is in the range of not less than 10 parts by weight and not more than 100 parts by weight, preferably 25 to 60 parts by weight, based on 100 parts by weight of the aforementioned actinic energy ray-curable resin (A). If the amount of the cyclic ether compound (D) to be incorporated is less than 10 parts by weight, the hygroscopicity of the cured film will tend to become so high that the PCT resistance will be degraded and the resistance to soldering heat and resistance to electroless plating will be degraded. Conversely, if the amount exceeds 100 parts by weight, the developing properties of the coating film and the resistance to electroless plating of the cured film will be degraded and the PCT resistance will also be degraded.

As the curing catalyst (E) mentioned above, for example, imidazole and imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, 4-methyl-N,N-dimethylbenzylamine; hydrazine compounds such as hydrazide adipate and hydrazide sebacate; and phosphorus compound such as triphenylphosphine may be cited. The curing catalysts which are commercially available include products of Shikoku Chemicals Co., Ltd., 2MZ-A, 2MZ-OK, 2PHZ, 2P4BHZ, and 2P4MHZ (invariably trade names for imidazole type compounds) and products of Sun-Apro K.K., U-CAT3503X and U-CAT3502X (invariably trade names for isocyanate compounds blocked with dimethyl amine) and DBU, DBN, U-CATSA102, and U-CAT5002 (invariably trade names for dicyclic amizine compounds and salts thereof), for example. The curing catalysts are not limited to the compounds cited above and any curing catalysts for the cyclic ether compound or any compounds which can promote the reaction of a cyclic ether group (epoxy group or oxetanyl group) with a carboxyl group may be used. The curing catalysts may be used either singly or in the form of a mixture of two or more members. Furthermore, S-triazine derivatives which also act as an adhesiveness-imparting agent, such as guanamine, acetoguanamine, benzoguanamine, melamine, 2,4-diamino-6-methacryloyloxyethyl-S-triazine, 2-vinyl-4,6-diamino-S-triazine, isocyanuric acid adduct of 2-vinyl-4,6-diamino-S-triazine, isocyanuric acid adduct of 2,4-diamino-6-methacryloyloxyethyl-S-triazine can also be used. Preferably, the compound which also acts as an adhesiveness-imparting agent is used in combination with the curing catalyst mentioned above. The amount of the curing catalyst (E) mentioned above to be incorporated in the composition may be in the conventionally used range, for example, in the range of 0.1 to 20 parts by weight, preferably 0.5 to 15.0 parts by weight, based on 100 parts by weight of the actinic energy ray-curable resin (A) mentioned above.

Further, the photocurable and thermosetting resin composition of the present invention may contain an actinic energy ray-curable resin (F) other than the actinic energy ray-curable resin (A) mentioned above in amounts not so large as to impair the effects of the present invention.

As the other actinic energy ray-curable resin (F), any resin may be used insofar as it has an unsaturated group and a carboxyl group and it is not limited to a particular one. However, the resins as listed below can be particularly advantageously used:

(1) carboxyl group-containing photosensitive resins obtained by adding ethylenically unsaturated groups as pendants to a copolymer of an unsaturated carboxylic acid and an unsaturated double bond-containing compound, (2) carboxyl group-containing photosensitive resins obtained by reacting an unsaturated carboxylic acid with a copolymer of a compound having an epoxy group and an unsaturated double bond and an unsaturated double bond-containing compound and further reacting a polybasic acid anhydride with a secondary hydroxyl group caused by the above reaction, (3) carboxyl group-containing photosensitive resins obtained by reacting a compound having a hydroxyl group and an unsaturated double bond with a copolymer of an unsaturated double bond-containing acid anhydride and an unsaturated double bond-containing compound, (4) carboxyl group-containing photosensitive resins obtained by reacting an epoxy compound with an unsaturated monocarboxylic acid and further reacting a polybasic acid anhydride with a secondary hydroxyl group caused by the above reaction, (5) carboxyl group-containing photosensitive resins obtained by further reacting a compound having an epoxy group and an unsaturated double bond with a carboxyl group-containing resin obtained by the reaction of a polybasic acid anhydride with a hydroxyl group-containing polymer, (6) carboxyl group-containing photosensitive resins obtained by reacting an unsaturated monocarboxylic acid with a polyfunctional oxetane compound and further reacting a polybasic acid anhydride with a primary hydroxyl group of the resultant modified oxetane resin, and (7) carboxyl group-containing photosensitive resins obtained by reacting an unsaturated monocarboxylic acid with a polynuclear epoxy compound and further reacting a polybasic acid anhydride with a primary hydroxyl group of the reaction product.

Among other carboxyl group-containing photosensitive resins cited above, the incorporation of the actinic energy ray-curable resin obtained by using a cresol novolak type epoxy compound proves to be particularly desirable for the purpose of improving the heat resistance of a cured product obtained.

The photocurable and thermosetting resin composition of the present invention may further incorporate therein a spherical porous filler (G), for the purpose of decreasing the dielectric constant and the dielectric dissipation factor of a cured product thereof without inducing the reduction in various properties such as the coating properties and heat resistance. As a material for the spherical porous filler (G), silica and cross-linked resinous substances may be cited.

When a usual filler is incorporated in the photocurable and thermosetting resin composition, the dielectric constant and the dielectric dissipation factor of a cured product is governed by the dielectric constant and the dielectric dissipation factor of the filler. However, when a spherical porous filler is incorporated in the composition, the dielectric characteristics thereof can be lowered because the filler retains air in its pores. In order to retain the air therein, the spherical porous filler is preferred to have an average particle diameter in the range of 1 to 15 µm, more preferably in the range of 1 to 10 µm. Further, the spherical porous filler is preferred to have the oil absorption in the approximate range of 50 to 800 $m^2/g$, preferably 100 to 200 $m^2/g$.

The amount of the spherical porous filler (G) to be incorporated in the composition is preferred to be in the range of not less than 5 parts by weight and not more than 100 parts by weight, preferably not more than 50 parts by weight, based on 100 parts by weight of the actinic energy ray-curable resin (A) mentioned above.

The photocurable and thermosetting resin composition of the present invention may incorporate therein an epoxidized polybutadiene (H) for the purpose of imparting the flexibility and toughness thereto. This epoxidized polybutadiene (H) includes, for example, EPOLEAD PB3600, PB4700, etc. manufactured by Daicel Chemical Industries, Ltd. The amount of the epoxidized polybutadiene to be incorporated in the composition is preferred to be in the range of 5 to 50 parts by weight, based on 100 parts by weight of the actinic energy ray-curable resin (A) mentioned above.

Furthermore, the composition may incorporate therein spherical urethane beads (I) of an average particle diameter in the range of 1 to 15 μm for the purpose of imparting the flexibility and the low warpage thereto. The amount of spherical urethane beads (I) to be incorporated in the composition is preferred to be in the range of 5 to 100 parts by weight, based on 100 parts by weight of the actinic energy ray-curable resin (A) mentioned above.

The photocurable and thermosetting resin composition of the present invention may further incorporate therein, as occasion demands, any known and widely used inorganic filler such as barium sulfate, barium titanate, silicon oxide powder, finely pulverized silicon oxide, amorphous silica, crystalline silica, fused silica, spherical silica, talc, clay, magnesium carbonate, calcium carbonate, aluminum oxide, aluminum hydroxide, and mica singly or in the combination of two or more members. These fillers are used for the purpose of suppressing the shrinkage of a coating film on curing and enhancing the characteristics of the coating film such as adhesiveness and hardness. The suitable amount of the inorganic filler to be incorporated in the composition is in the range of 10 to 300 parts by weight, preferably 30 to 200 parts by weight, based on 100 parts by weight of the actinic energy ray-curable resin (A) mentioned above.

The composition of the present invention may further incorporate therein, as occasion demands, any known and commonly used coloring agent such as phthalocyanine blue, phthalocyanine green, iodine green, disazo yellow, crystal violet, titanium oxide, carbon black, and naphthalene black, any known and commonly used thermal polymerization inhibitor such as hydroquinone, hydroquinone monomethyl ether, tert-butyl catechol, pyrogallol, and phenothiazine, any known and commonly used thickening agent such as finely powdered silica, organobentonite, and montmorillonite, an anti-foaming agent and/or leveling agent of the silicone type, fluorine type, or macromolecular type, a silane coupling agent such as an imidazole-based compound, a thiazole-based compound, or a triazole-based compound, or any other known and commonly used additives.

The photocurable and thermosetting resin composition of the present invention may be obtained by compounding the components (A), (B), (C), (D), (E), (F), (G), (H), and (I) mentioned above, and further an inorganic filler and other components mentioned above when necessary, preferably in the proportion mentioned above, and homogeneously mixing, dissolving and dispersing them with a roll mill or the like. This composition of the present invention is usually in the liquid state, it may be formed into a dry film.

In the manufacture of a dry film, the composition of the present invention as mentioned above is applied to a base film (a release film), for example, with the use of a roll coater, a doctor bar, a wire bar method, a dipping method, a spin coating method, a gravure method, a doctor blade method, etc. and then dried in a drying oven set to a temperature in the range of 60 to 100° C. to remove by evaporation a prescribed amount of the diluent (C) from the composition, and a release film or the like is laminated thereon if appropriate, to give rise to a dry film. In this process the thickness of the coating film on the base film is adjusted so as to be in the range of 5 to 160 μm, preferably 10 to 60 μm. As the base film, various films made of, for example, polyethylene terephthalate, polypropylene, etc. may be suitably used.

The photocurable and thermosetting resin composition of the present invention having such a composition as described above is adjusted to a level of viscosity suitable for a particular coating method by dilution when necessary, then applied by the technique of screen printing, curtain coating, spray coating, roll coating, or the like to a printed circuit board having a circuit preparatorily formed thereon, and then dried at a temperature in the approximate range of 60 to 100° C., for example, to expel by evaporation the organic solvent contained in the composition to produce a coating film. When the composition is in the form of a dry film, it may be merely laminated as it is. The coating film is then selectively exposed to actinic radiation through a photomask having a prescribed exposure pattern and the unexposed area of the coating film is developed with an aqueous alkaline solution to form a resist pattern. The resist film formed in the prescribed pattern as described above is finally cured by irradiation with actinic energy rays and subsequent heating, or by heating and subsequent irradiation with actinic energy rays, or by heating only to give birth to a cured film (solder resist film) which exhibits low dielectric characteristics and excels in adhesiveness, resistance to electroless plating, electrical properties, flexibility, resistance to moisture absorption, and PCT (pressure cooker test) resistance.

As an aqueous alkaline solution mentioned above, aqueous alkaline solutions of potassium hydroxide, sodium hydroxide, sodium carbonate, potassium carbonate, sodium phosphate, sodium silicate, ammonia, amines, etc. can be used.

Suitable light sources which are used for the purpose of photocuring the composition are a low-pressure mercury vapor lamp, a medium-pressure mercury vapor lamp, a high-pressure mercury vapor lamp, an ultra-high-pressure mercury vapor lamp, a xenon lamp, and a metal halide lamp, for example. Also, a laser beam may be used as the actinic energy rays.

When the photocurable and thermosetting resin composition of the present invention is used for the formation of an interlaminar insulating resin layer in a multi-layer printed circuit board, it is adjusted to a level of viscosity suitable for a particular coating method when necessary, then applied by a heretofore known method as described above onto a conductive layer of a printed circuit board having a circuit preparatorily formed thereon, for example, and, when necessary, dried at a temperature in the approximate range of 60 to 100° C., for example, to produce a tuck-free coating film. When the composition is in the form of a dry film, it may be merely laminated as it is. The coating film is then selectively exposed to actinic radiation through a negative film having a prescribed light impermeable pattern such as black circles and the unexposed areas of the coating film are developed, for example, with an aqueous alkaline solution as mentioned above to form via-holes corresponding to the black circles of the negative film. Thereafter, the formation of a through-hole such as a prescribed electrically conductive hole between layers is performed when necessary, the coating film is then subjected to a surface roughening treatment with a roughening agent such as an oxidizing agent, an aqueous alkaline solution, and an organic solvent. The surface of the insulating resin layer roughened is coated with a conductive layer by electroless plating, electroplating, etc. and then subjected to a heat treatment to increase the cross-linking density of the insulating resin layer mentioned above and simultaneously to effect the relaxation of stress. By curing the insulating resin layer by heating at a temperature in the approximate range of 140 to 180° C., for example, the interlaminar insulating resin layer excelling in various properties such as impact resistance, heat resistance, resistance to solvents, resistance to acids, resistance to moisture absorption, PCT resistance, adhesiveness, and electrical properties may be formed. Thereafter, a conductive layer of a circuit is formed by etching the surface of the conductive layer superposed on the surface of the insulating resin layer in a conventional manner to form a prescribed circuit pattern. Further, the insulating resin layers and the conductive layers of a prescribed circuit pattern may be alternately built up by repeating such steps one after another to a desired extent.

Incidentally, the photocurable and thermosetting resin composition of the present invention may be used not only as the insulating resin layer in a method of producing a multi-layer printed circuit board by the build-up process mentioned above but also, for example, in the formation of the insulating resin layer in a multi-layer printed circuit board by a lamination process with a copper foil provided with a resin or as an insulating resin composition for a prepreg to be used in the laminating press method.

Now, the present invention will be more specifically described below with reference to working examples and comparative examples. It should be noted, however, that the following Examples are intended to be merely illustrative of the present invention and it is natural that that the present invention is not limited to the following Examples. Wherever "parts" and "%" are mentioned hereinbelow, they invariably refer to those based on weight unless otherwise specified.

Synthesis Example 1

Into a flask equipped with a gas introduction tube, a stirrer, a condenser, and a thermometer, 192 parts of trimellitic anhydride, 116 parts of hydroxyethyl acrylate and 0.4 part of methylhydroquinone as a thermal polymerization inhibitor were charged and left reacting for 12 hours at 95° C. to obtain an addition product (I), benzene-1,2,4-tricarboxylic acid 1-(2-acryloyloxy-ethyl)ester.

Next, into a flask equipped with a gas introduction tube, a stirrer, a condenser, and a thermometer, 154 parts of benzene-1,2,4-tricarboxylic acid 1-(2-acryloyloxy-ethyl) ester obtained as described above, 172 parts of hexahydrophthalic acid and 1000 parts of hydrogenated bisphenol A diglycidyl ether having an epoxy equivalent of 250 g/eq. ("YL-6663" manufactured by Japan Epoxy Resin K.K.) were charged and stirred at 100° C. under nitrogen atmosphere. Thereafter, 5.2 parts of triphenylphosphine was added to the mixture and the temperature in the flask was increased to 150° C. The reaction was continued for about 90 minutes while keeping the temperature at 150° C. to obtain an epoxy resin having an epoxy equivalent of 1326 g/eq.

Further, in a flask equipped with a stirrer, a condenser, and a thermometer, 663 parts of the resultant epoxy resin and 370 parts of carbitol acetate added thereto were dissolved by heating. Then, 0.46 part of methylhydroquinone was added to the solution. The resultant mixture kept heated to 95-105° C. and 36 parts of acrylic acid gradually added dropwise thereto were left reacting for 20 hours to obtain a polyfunctional acrylate resin. This polyfunctional acrylate resin was cooled to 80-90° C. and made to add 152 parts of tetrahydrophthalic anhydride and they were left reacting for 8 hours. The reaction was followed up by the addition ratio obtained by the total acid value and the acid value of the reaction solution measured by potentiometric titration and the reaction ratio of 95% or more was regarded as the completion of the reaction.

The carboxyl group-containing actinic energy ray-curable resin consequently obtained was found to have an acid value of 65.9 mg KOH/g as solids. This reaction solution will be referred to hereinafter as "varnish A-1".

Synthesis Example 2

Into a flask equipped with a gas introduction tube, a stirrer, a condenser, and a thermometer, 154 parts of benzene-1,2,4-tricarboxylic acid 1-(2-acryloyloxy-ethyl)ester obtained in the same manner as in Synthesis Example 1 mentioned above, 172 parts of hexahydrophthalic acid and 756 parts of bisphenol A diglycidyl ether having an epoxy equivalent of 189 g/eq. ("EPIKOTE 828" manufactured by Japan Epoxy Resin K.K.) were charged and stirred at 100° C. under nitrogen atmosphere. Thereafter, 5.2 parts of triphenylphosphine was added to the mixture and the temperature in the flask was increased to 150° C. The reaction was continued for about 90 minutes while keeping the temperature at 150° C. to obtain an epoxy resin having an epoxy equivalent of 1082 g/eq.

Further, in a flask equipped with a stirrer, a condenser, and a thermometer, 541 parts of the resultant epoxy resin and 370 parts of carbitol acetate added thereto were dissolved by heating. Then, 0.46 part of methylhydroquinone was added to the solution. The resultant mixture kept heated to 95-105° C. and 36 parts of acrylic acid gradually added dropwise thereto were left reacting for 20 hours to obtain a polyfunctional acrylate resin. This polyfunctional acrylate resin was cooled to 80-90° C. and made to add 152 parts of tetrahydrophthalic anhydride and they were left reacting for 8 hours. The reaction was followed up by the addition ratio obtained by the total acid value and the acid value of the reaction solution measured by potentiometric titration and the reaction ratio of 95% or more was regarded as the completion of the reaction.

The carboxyl group-containing actinic energy ray-curable resin consequently obtained was found to have an acid value of 77.0 mg KOH/g as solids. This reaction solution will be referred to hereinafter as "varnish A-2".

Synthesis Example 3

Into a flask equipped with a gas introduction tube, a stirrer, a condenser, and a thermometer, 154 parts of benzene-1,2,4-tricarboxylic acid 1-(2-acryloyloxy-ethyl)ester obtained in the same manner as in Synthesis Example 1 mentioned above, 166 parts of terephthalic acid and 1000 parts of hydrogenated bisphenol A diglycidyl ether having an epoxy equivalent of 250 g/eq. ("YL-6663" manufactured by Japan Epoxy Resin K.K.) were charged and stirred at 100° C. under nitrogen atmosphere. Thereafter, 5.2 parts of triphenylphosphine was added to the mixture and the temperature in the flask was increased to 150° C. The reaction was continued for about 90 minutes while keeping the temperature at 150° C. to obtain an epoxy resin having an epoxy equivalent of 1320 g/eq.

Further, in a flask equipped with a stirrer, a condenser, and a thermometer, 660 parts of the resultant epoxy resin and 370 parts of carbitol acetate added thereto were dissolved by heating. Then, 0.46 part of methylhydroquinone was added to the solution. The resultant mixture kept heated to 95-105° C. and 36 parts of acrylic acid gradually added dropwise thereto were left reacting for 20 hours to obtain a polyfunctional acrylate resin. This polyfunctional acrylate resin was cooled to 80-90° C. and made to add 45.5 parts of tetrahydrophthalic anhydride and they were left reacting for 8 hours. The reaction was followed up by the addition ratio obtained by the total acid value and the acid value of the reaction solution measured by potentiometric titration and the reaction ratio of 95% or more was regarded as the completion of the reaction.

The carboxyl group-containing actinic energy ray-curable resin consequently obtained was found to have an acid value of 66.2 mg KOH/g as solids. This reaction solution will be referred to hereinafter as "varnish A-3".

Comparative Synthesis Example 1

Into a flask equipped with a gas introduction tube, a stirrer, a condenser, and a thermometer, 154 parts of benzene-1,2,4-tricarboxylic acid 1-(2-acryloyloxy-ethyl)ester obtained in the same manner as in Synthesis Example 1 mentioned above, 166 parts of terephthalic acid and 756 parts of bisphenol A diglycidyl ether having an epoxy equivalent of 189 g/eq. ("EPIKOTE 828" manufactured by Japan Epoxy Resin K.K.) were charged and stirred at 100° C. under nitrogen atmosphere. Thereafter, 5.2 parts of triphenylphosphine was added to the mixture and the temperature in the flask was increased to 150° C. The reaction was continued for about 90 minutes while keeping the temperature at 150° C. to obtain an epoxy resin having an epoxy equivalent of 1076 g/eq.

Further, in a flask equipped with a stirrer, a condenser, and a thermometer, 538 parts of the resultant epoxy resin and 370 parts of carbitol acetate added thereto were dissolved by heating. Then, 0.46 part of methylhydroquinone was added to the solution. The resultant mixture kept heated to 95-105° C. and 36 parts of acrylic acid gradually added dropwise thereto were left reacting for 20 hours to obtain a polyfunctional acrylate resin. This polyfunctional acrylate resin was cooled to 80-90° C. and made to add 152 parts of tetrahydrophthalic anhydride and they were left reacting for 8 hours. The reaction was followed up by the addition ratio obtained by the total acid value and the acid value of the reaction solution measured by potentiometric titration and the reaction ratio of 95% or more was regarded as the completion of the reaction.

The carboxyl group-containing actinic energy ray-curable resin consequently obtained was found to have an acid value of 81.3 mg KOH/g as solids. This reaction solution will be referred to hereinafter as "varnish B-1".

Comparative Synthesis Example 2

In a flask equipped with a gas introduction tube, a stirrer, a condenser, and a thermometer, 330 parts of a cresol novolak type epoxy resin (EPICLON N-695, product of Dainippon Ink & Chemicals, Inc., epoxy equivalent; 220) and 400 parts of carbitol acetate added thereto were dissolved by heating. Then, 0.46 part of hydroquinone and 1.38 parts of triphenylphosphine were added to the solution. The resultant mixture kept heated to 95-105° C. and 108 parts of acrylic acid gradually added dropwise thereto were left reacting for 16 hours. The reaction product was cooled to 80-90° C. and made to add 163 parts of tetrahydrophthalic anhydride and they were left reacting for 8 hours. The reaction was followed up by the addition ratio obtained by the total acid value and the acid value of the reaction solution measured by potentiometric titration and the reaction ratio of 95% or more was regarded as the completion of the reaction. The carboxyl group-containing photosensitive resin consequently obtained was found to have an acid value of 100 mg KOH/g as solids.

This reaction solution will be referred to hereinafter as "varnish B-2".

Examples 1-3 and Comparative Examples 1 and 2

The components accounting for varying ratios of combination shown in Table 1 and using the varnishes obtained in the synthesis examples 1-3 and comparative synthesis examples 1 and 2 mentioned above were severally kneaded with a three-roll mill to obtain photocurable and thermosetting resin compositions. The characteristics of these compositions are shown in Table 2.

TABLE 1

| Components (parts by weight) | | Examples 1 | Examples 2 | Examples 3 | Comparative Examples 1 | Comparative Examples 2 |
|---|---|---|---|---|---|---|
| Varnish | A-1 | 143.5 | — | — | — | — |
| | A-2 | — | 150.8 | — | — | — |
| | A-3 | — | — | 143.7 | — | — |
| | B-1 | — | — | — | 153.6 | — |
| | B-2 | — | — | — | — | 166.7 |
| Irgacure 369 [1] | | 4.0 | 4.0 | 4.0 | 4.0 | 4.0 |
| Melamine | | 2.0 | 2.0 | 2.0 | 2.0 | 2.0 |
| DPHA [2] | | 15.0 | 18.0 | 18.0 | 18.0 | 18.0 |
| EPICLON N-695 [3] | | 31.7 | 37.0 | 31.8 | 39.1 | 48.1 |
| Barium sulfate | | 100.0 | 100.0 | 100.0 | 100.0 | 100.0 |
| Phthalocyanine green | | 1.0 | 1.0 | 1.0 | 1.0 | 1.0 |
| Carbitol acetate | | 5.0 | 5.0 | 5.0 | 5.0 | 5.0 |

Remarks
[1] Photopolymerization initiator produced by Ciba Specialty Chemicals Inc. 2-benzyl-2-dimethylamino-1-(4-morpholinophenyl)-butan-1-one
[2] Dipentaerythritol hexaacrylate
[3] Cresol novolak type epoxy resin produced by Dainippon Ink and Chemicals Inc.

TABLE 2

| Properties | | Examples 1 | Examples 2 | Examples 3 | Comparative Examples 1 | Comparative Examples 2 |
|---|---|---|---|---|---|---|
| Sensitivity | 100 mJ/cm$^2$ | 6 | 4 | 5 | 3 | 2 |
| | 200 mJ/cm$^2$ | 7 | 6 | 6 | 4 | 3 |
| | 300 mJ/cm$^2$ | 8 | 7 | 7 | 5 | 4 |
| Tensile modulus (Gpa) | | 2.5 | 2.5 | 2.6 | 2.6 | 3.7 |
| Tensile strength (MPa) | | 65 | 68 | 65 | 57 | 58 |
| Elongation (%) | | 4.4 | 5.1 | 3.7 | 2.8 | 2.6 |
| Water absorption (%) | | 1.1 | 1.2 | 1.2 | 1.3 | 1.4 |
| Dielectric constant | | 3.2 | 3.3 | 3.3 | 3.5 | 3.5 |
| Dielectric dissipation factor | | 0.020 | 0.025 | 0.023 | 0.028 | 0.030 |
| Electrical insulation (×10$^{13}$ Ω) | | 2.2 | 2.0 | 2.1 | 2.2 | 1.3 |
| PCT resistance | | ○ | ○ | ○ | ○ | Δ |
| Resistance to elecroless gold plating | | ○ | ○ | ○ | Δ | Δ |

The characteristics shown in Table 2 mentioned above were determined by the following methods.

(1) Sensitivity:

Each of the compositions of Examples and Comparative Examples mentioned above was applied by a screen printing method to the entire surface of a glass-epoxy substrate. After the coating film was dried for 20 minutes at 80° C. and left cooling to room temperature, it was exposed to light under reduced pressure by the use of step tablet No. 2 (21 steps) manufactured by KODAK JAPAN LTD. as a photomask and an exposure device (equipped with two metal halide lamps of 7 kW) manufactured by ORC Manufacturing Co., Ltd. (an irradiation dose of 100-300 mJ/cm$^2$ of ultraviolet light of 365 nm in wavelength measured with an integrating actinometer) and then developed for 60 seconds with an aqueous 1% Na$_2$CO$_3$ solution of 30° C. under a spraying pressure of 2 kg/cm$^2$. The sensitivity was visually evaluated based on the number of gloss steps of the resultant cured coating film. Incidentally, the increased number of gloss steps indicates that the sensitivity is high.

(2) Tensile Modulus, (3) Tensile Strength (Tensile Strength at Break), and (4) Elongation (Tensile Elongation at Break):

The tensile modulus, the tensile strength (tensile strength at break), and the elongation (tensile elongation at break) of the test samples produced by the following method were determined by a tensile and compression tester (manufactured by Shimadzu Seisakusho K.K.).

Each of the compositions of Examples and Comparative Examples mentioned above was applied by the screen printing method to a polytetrafluoroethylene plate washed with water and dried in advance, and dried in a hot air circulating drying oven at 80° C. for 30 minutes. The composition on the plate was left cooling to room temperature and exposed to light under the conditions of irradiation dose of 100 mJ/cm$^2$, and then cured in a hot air circulating drying oven at 150° C. for 60 minutes. The cured film was left cooling to room temperature and then removed from the polytetrafluoroethylene plate to obtain a test sample.

(5) Water Absorption:

Each of the compositions of Examples and Comparative Examples mentioned above was applied by the screen printing method to a glass sheet of which weight was measured in advance. The glass sheet covered with the composition was dried in a hot air circulating drying oven at 80° C. for 30 minutes. The composition on the sheet was left cooling to room temperature and exposed to light under the conditions of irradiation dose of 100 mJ/cm$^2$, and then cured in a hot air circulating drying oven at 150° C. for 60 minutes to obtain a test sample. The test sample was cooled to room temperature and then weighed. Subsequently, the test sample was treated for 24 hours in a PCT apparatus (TABAI ESPEC HAST SYSTEM TPC-412MD) under the conditions of 121° C., 100% R.H. and weighed to find the weight of the hardened product after the treatment. The water absorption of the hardened product was calculated by the following equation:

Water absorption (%)={(W2−W1)/(W1−Wg)}×100 where W1 is the weight of the test sample, W2 is the weight of the test sample after the PCT treatment, and Wg is the weight of the glass sheet.

(6) Dielectric Constant and Dielectric Dissipation Factor:

These characteristics were determined in accordance with the method specified in JIS (Japanese Industrial Standard) C 6481.

(7) Electrical Insulating Properties:

Each of the compositions of Examples and Comparative Examples mentioned above was applied to the entire surface of a comb electrode B coupon of IPC B-25 by using a roll coater manufactured by PILOT SEIKO K.K., and dried in a hot air circulating drying oven at 80° C. for 30 minutes. The composition on the substrate was left cooling to room temperature and exposed to light under the conditions of irradiation dose of 100 mJ/cm$^2$, and then cured in a hot air circulating drying oven at 150° C. for 60 minutes to obtain a test sample. The insulating resistance was measured by applying a bias voltage of DC 500V to the comb electrode.

(8) PCT Resistance:

Each of the compositions of Examples and Comparative Examples mentioned above was applied by the screen printing method to a printed circuit board, and dried in a hot air circulating drying oven at 80° C. for 30 minutes. The composition on the board was left cooling to room temperature and exposed to light under the conditions of irradiation dose of 100 mJ/cm$^2$, and then cured in a hot air circulating drying oven at 150° C. for 60 minutes to obtain a test sample. The test sample was left cooling to room temperature and then treated for 168 hours in the PCT apparatus (TABAI ESPEC HAST SYSTEM TPC-412MD) under the conditions of 121° C., 2 atmospheric pressure to evaluate the cured film condition. The criterion for evaluation is as follows:

◯: No discernible separation, discoloration, or dissolving out of the cured film observed.

Δ: Either of separation, discoloration, or dissolving out of the cured film observed.

x: Discernible separation, discoloration, or dissolving out of the cured film observed.

(9) Resistance to Electroless Gold Plating:

Each of the compositions of Examples and Comparative Examples mentioned above was applied by the screen printing method to a printed circuit board, and dried in a hot air circulating drying oven at 80° C. for 30 minutes. The composition on the board was left cooling to room temperature and exposed to light under the conditions of irradiation dose of 100 mJ/cm$^2$, and then cured in a hot air circulating drying oven at 150° C. for 60 minutes to obtain a test sample. The test sample was immersed in an acidic degreasing solution (a 20 vol. % solution of METEX L-5B manufactured by Japan MacDermid Co., Ltd.) of 30° C. for 3 minutes and then washed with water. Next, the test sample was immersed in an aqueous 14.4 wt. % ammonium persulfate solution at room temperature for 3 minutes, washed with water, and further immersed in an aqueous 10 vol. % sulfuric acid solution for one minute at room temperature. Thereafter, the test sample was immersed in a catalyst solution (a 10 vol. % aqueous solution of Metal Plate Activator 350 manufactured by Meltex Inc.) of 30° C. for 5 minutes, washed with water, then subjected to electroless nickel plating by dipping in a nickel plating solution (a 20 vol. % aqueous solution of Melplate Ni-865M, manufactured by Meltex Inc., pH 4.6) of 85° C. for 30 minutes, thereafter immersed in an aqueous 10 vol. % sulfuric acid solution at room temperature for one minute, and then washed with water. Next, the test sample was subjected to electroless gold plating by dipping in a gold plating solution (an aqueous solution of 15 vol. % of Aurolectroless UP manufactured by Meltex Inc. and 3 vol. % of gold potassium cyanide, pH 6) of 95° C. for 30 minutes. Then it was washed with water, immersed in hot water of 60° C. for 3 minutes, and then washed with running water. A cellophane adhesive tape was adhered to the resultant test sample plated with gold and separated therefrom to evaluate the conditions of the cured film after peeling. The criterion for evaluation is as follows:

◯: Absence of any discernible change.

Δ: Slight peeling of the cured film was observed.

x: Peeling of the cured film was observed.

It is clearly noted from the results shown in Table 2 that the cured product obtained by the use of the photocurable and thermosetting resin composition of the present invention excelled not only in dielectric characteristics but also in such properties as water absorption, adhesiveness, electrical insulating resistance, hardness, resistance to chemicals, and PCT resistance. On the contrary, the cured product of Comparative Example 1 obtained by the use of the actinic energy ray-curable resin prepared by the use of a bifunctional carboxyl group-containing compound (II) and a bifunctional epoxy compound (III) both having aromatic rings was deficient in sensitivity and resistance to electroless gold plating. On the other hand, the cured product of Comparative Example 2 obtained by the use of the actinic energy ray-curable resin prepared by the use of a cresol novolak type epoxy resin as a starting raw material was deficient not only in sensitivity and resistance to electroless gold plating but also in water absorption and PCT resistance. As being clear from the comparison of the results shown in Table 2 concerning sensitivity of Examples 1-3 and Comparative Examples 1 and 2, since the photocurable and thermosetting resin compositions of Examples 1-3 excels in sensitivity in comparison with the photocurable and thermosetting resin compositions of Comparative Examples 1 and 2, they allow attainment of the same degree of photocure with a smaller irradiation dose and thus are advantageous in energy cost and workability.

As described above, since the photocurable and thermosetting resin composition of the present invention excels in the photocuring properties, the developing properties with an alkaline solution, and adhesiveness to a substrate and gives a cured product excelling in such properties as low dielectric properties, water resistance, resistance to electroless plating, resistance to chemicals, electrical insulating properties, flexibility, and PCT resistance, it is useful as coating materials, printing ink, adhesives, various resist materials, materials for the manufacture of color filters, and the like, particularly it may be advantageously used as solder resists for printed circuit boards and interlaminar insulating materials for multilayer printed circuit boards, and the like.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

The International Application PCT/JP2004/004680, filed Mar. 31, 2004, describes the invention described hereinabove and claimed in the claims appended hereinbelow, the disclosure of which is incorporated here by reference.

What is claimed is:

1. An actinic energy ray-curable resin obtained by reacting an unsaturated monocarboxylic acid with a terminal epoxy group of an epoxy resin having an unsaturated group and a hydroxyl group in side chains and an epoxy group in a terminal and further reacting a polybasic acid anhydride with the hydroxyl group of said epoxy resin,
wherein said epoxy resin is a product of the polyaddition reaction of a reaction product of a polybasic acid anhydride and a compound having at least one unsaturated double bond and one alcoholic hydroxyl group in a molecule, a compound having at least two carboxyl groups in a molecule, and a bifunctional epoxy compound, and said compound having at least two carboxyl groups in a molecule is at least one compound selected from the group consisting of 1,2-cyclohexene dicarboxylic acid, tetrahydrophthalic acid, hexahydrophthalic acid, hexahydroisophthalic acid, and hexahydroterephthalic acid and containing no aromatic ring.

2. The actinic energy ray-curable resin according to claim 1, wherein said bifunctional epoxy compound is a hydrogenated bifunctional epoxy compound.

3. A photocurable and thermosetting resin composition capable of being developed with an aqueous alkaline solution, comprising:
an actinic energy ray-curable resin obtained by reacting an unsaturated monocarboxylic acid with a terminal epoxy group of an epoxy resin having an unsaturated group and a hydroxyl group in side chains and an epoxy group in a terminal and further reacting a polybasic acid anhydride with the hydroxyl group of said epoxy resin;
a photopolymerization initiator;
a diluent; and
a cyclic ether compound containing two or more epoxy groups and/or oxetanyl groups in a molecule,
wherein said epoxy resin is a product of the polyaddition reaction of a reaction product of a polybasic acid anhydride and a compound having at least one unsaturated double bond and one alcoholic hydroxyl group in a molecule, a compound having at least two carboxyl groups in a molecule, and a bifunctional epoxy compound and said compound having at least two carboxyl groups in a molecule in said actinic energy ray-curable resin is at least one compound selected from the group consisting of 1,2-cyclohexene dicarboxylic acid, tetrahydrophthalic acid, hexahydrophthalic acid, hexahydroisophthalic acid, and hexahydroterephthalic acid and containing no aromatic ring.

4. The composition according to claim 3, wherein said bifunctional epoxy compound in said actinic energy ray-curable resin is a hydrogenated bifunctional epoxy compound.

5. The composition according to claim 3, further comprising a curing catalyst.

6. The composition according to claim 3, further comprising an actinic energy ray-curable resin other than said actinic energy ray-curable resin.

7. The composition according to claim 3, further comprising a filler.

8. The composition according to claim 3, which is in the state of liquid.

9. The composition according to claim 3, which is in the form of a dry film.

10. A cured product obtained by curing the photocurable and thermosetting resin composition set forth in claim 3 by means of irradiation of actinic energy rays and/or heating.

11. A printed circuit board having an interlaminar insulating layer and/or a solder resist layer formed from the photocurable and thermosetting resin composition set forth in claim 3.

12. An actinic energy ray-curable resin obtained by reacting an unsaturated monocarboxylic acid with a terminal epoxy group of an epoxy resin having an unsaturated group and a hydroxyl group in side chains and an epoxy group in a terminal and further reacting a polybasic acid anhydride with the hydroxyl group of said epoxy resin,
wherein said epoxy resin is a product of the polyaddition reaction of a reaction product of a polybasic acid anhydride and a compound having at least one unsaturated double bond and one alcoholic hydroxyl group in a molecule, a compound having at least two carboxyl groups in a molecule, and a bifunctional epoxy compound, and said bifunctional epoxy compound is a hydrogenated bifunctional epoxy compound.

13. A photocurable and thermosetting resin composition capable of being developed with an aqueous alkaline solution, comprising:

an actinic energy ray-curable resin obtained by reacting an unsaturated monocarboxylic acid with a terminal epoxy group of an epoxy resin having an unsaturated group and a hydroxyl group in side chains and an epoxy group in a terminal and further reacting a polybasic acid anhydride with the hydroxyl group of said epoxy resin;

a photopolymerization initiator;

a diluent; and a cyclic ether compound containing two or more epoxy groups and/or oxetanyl groups in its molecule, wherein said epoxy resin is a product of the polyaddition reaction of a reaction product of a polybasic acid anhydride and a compound having at least one unsaturated double bond and one alcoholic hydroxyl group in a molecule, a compound having at least two carboxyl groups in a molecule, and a bifunctional epoxy compound, and said bifunctional epoxy compound in said actinic energy ray-curable resin is a hydrogenated bifunctional epoxy compound.

14. The composition according to claim 13, further comprising a curing catalyst.

15. The composition according to claim 13, further comprising an actinic energy ray-curable resin other than said actinic energy ray-curable resin.

16. The composition according to claim 13, further comprising a filler.

17. The composition according to claim 13, which is in the state of liquid.

18. The composition according to claim 13, which is in the form of a dry film.

19. A cured product obtained by curing the photocurable and thermo setting resin composition set forth in claim 13 by means of irradiation of actinic energy rays and/or heating.

20. A printed circuit board having an interlaminar insulating layer and/or a solder resist layer formed from the photocurable and thermosetting resin composition set forth in claim 13.

* * * * *